US008633744B1

United States Patent
Lu et al.

(10) Patent No.: US 8,633,744 B1
(45) Date of Patent: Jan. 21, 2014

(54) POWER RESET CIRCUIT WITH ZERO STANDBY CURRENT CONSUMPTION

(71) Applicant: Eon Silicon Solution Inc., Chu-Pei (TW)

(72) Inventors: Hsiao-Hua Lu, Chu-Pei (TW); Chih-Ming Kuo, Chu-Pei (TW); Yu-Chun Wang, Chu-Pei (TW)

(73) Assignee: Eon Silicon Solutions, Inc. (TW)

( * ) Notice: Subject to any disclaimer, the term of this patent is extended or adjusted under 35 U.S.C. 154(b) by 0 days.

(21) Appl. No.: 13/761,271

(22) Filed: Feb. 7, 2013

(51) Int. Cl.
*H03L 7/00* (2006.01)

(52) U.S. Cl.
USPC .......................... 327/143; 327/142; 327/198

(58) Field of Classification Search
USPC ......................... 327/142, 143, 198
See application file for complete search history.

(56) References Cited

U.S. PATENT DOCUMENTS

| 2003/0214329 A1* | 11/2003 | Shin ............................ 327/143 |
| 2004/0263222 A1* | 12/2004 | Tseng et al. ................. 327/143 |
| 2005/0134345 A1* | 6/2005 | McClure ...................... 327/198 |

* cited by examiner

*Primary Examiner* — John Poos
(74) *Attorney, Agent, or Firm* — Schmeiser, Olsen & Watts, LLP

(57) ABSTRACT

A power reset circuit with zero standby current consumption includes a power storage unit, first, second, and third voltage detection units, a switching unit, and a power reset unit. The power storage unit stores electric power by a supply voltage source. The first, second, and third voltage detection units are connected to the supply voltage source to start a switching circuit of the first, second, and third voltage detection units in accordance with a change in a normal supply stage, a shut-down stage, and a voltage ramp-up stage of the supply voltage source, control a voltage level of the power reset unit, and thereby generate the power reset signal. Accordingly, the power reset circuit does not consume current in a standby state (the normal supply stage of the supply voltage source) and thus is characterized by zero current consumption.

8 Claims, 2 Drawing Sheets

POWER RESET CIRCUIT WITH ZERO STANDBY CURRENT CONSUMPTION

FIELD OF TECHNOLOGY

The present invention relates to power reset circuits, and more particularly, to a power reset circuit with zero standby current consumption.

BACKGROUND

Chips of integrated circuits play an important role in various electronic devices. According to the prior art, the chips receive different voltage supply, depending on whether the host power is undergoing normal operation, standby operation, or shutdown. If a power supply host hangs or starts from a shutdown state, the chips will have to be reset in order to ensure that the chips can operate normally.

The generation of a reset signal of a chip is controlled by a power reset circuit. As described above, if the power supply host hangs or starts from a shutdown state, a power reset circuit will have to generate a power reset signal for triggering a corresponding one of the chips to reset.

However, in a normal power supply state of the power supply host, a conventional power reset circuit is operating in a standby state. In this state, the conventional power reset circuit still consumes a specific amount of current. The aforesaid current consumption is undesired, as it is likely to generate undesired heat, shorten the service life of a chip, and shorten the service life of a battery.

SUMMARY

It is an objective of the present invention to provide a power reset circuit for detecting a supply voltage source and generating a reset signal to reset a chip in response to a power supply shutdown.

Another objective of the present invention is to allow the power reset circuit not to consume current during a standby state.

In order to achieve the above and other objectives, the present invention provides a power reset circuit for generating a power reset signal according to a change of a supply voltage source, comprising: a power storage unit having a first critical voltage level, having an input end connected to the supply voltage source and an output end connected to the first reference node, being discharged when a voltage level of the supply voltage source is higher than the first critical voltage level, and discharging when a voltage level of the supply voltage source is lower than the first critical voltage level; a first voltage detection unit connected between the first reference node and a second reference node to receive the supply voltage source, thereby causing a voltage of the second reference node to track a voltage of the first reference node when the supply voltage source is lower than a second critical voltage level, and thereby reducing a voltage of the second reference node to a reference voltage when the supply voltage source is higher than a second critical voltage level; a second voltage detection unit connected between the supply voltage source and the second reference node and connected to a third reference node, so as to enable a current path between the second reference node and the supply voltage source of the second voltage detection unit only when the third reference node has the reference voltage; a third voltage detection unit connected between the supply voltage source and the third reference node and connected to the second reference node, so as to enable a current path between the third reference node and the supply voltage source of the third voltage detection unit only when the second reference node has the reference voltage; a switching unit connected between the third reference node and a reference voltage end and connected to the second reference node so as to enable a current path between the reference voltage end and the third reference node of the switching unit only when the second reference node has the reference voltage, thereby reducing a voltage of the third reference node to the reference voltage; and a power reset unit having an input end connected to the third reference node and an output end for generating and outputting the power reset signal according to a voltage level of the third reference node.

In an embodiment, the power storage unit comprises: a first transistor of the second conductivity type, having a gate and a source both connected to the supply voltage source, and having a drain connected to the first reference node; and a second transistor of the second conductivity type, having the first critical voltage level, having a gate connected to the first reference node, and having a source and a drain both grounded.

In an embodiment, the first voltage detection unit comprises: transistors of the first conductivity type, having the second critical voltage level, being two series-connected transistors of the first conductivity type, and each having a gate connected to the supply voltage source, wherein a source of a first one of the transistors of the first conductivity type is connected to the first reference node, wherein a drain of a second one of the transistors of the first conductivity type is connected to the second reference node, wherein electrical conduction between the two transistors of the first conductivity type will be enabled only if the supply voltage source is lower than the second critical voltage level; and transistors of the second conductivity type, having the second critical voltage level, being three series-connected transistors of the second conductivity type, and each having a gate connected to the supply voltage source, wherein a source of a first one of the transistors of the second conductivity type is connected to the second reference node, wherein a drain of a third one of the transistors of the second conductivity type is connected to the reference voltage, wherein electrical conduction between the three transistors of the second conductivity type will be enabled only if the supply voltage source is higher than the second critical voltage level.

In an embodiment, the second voltage detection unit comprises: a first transistor of the first conductivity type, having a source connected to the supply voltage source, a drain connected to the second reference node, and a gate connected to the third reference node, wherein a starting voltage of the first transistor of the first conductivity type is the reference voltage.

In an embodiment, the third voltage detection unit comprises: a second transistor of the first conductivity type, having a source connected to the supply voltage source and a gate connected to the second reference node; and a third transistor of the first conductivity type, having a source connected to a drain of the second transistor of the first conductivity type, a gate connected to the second reference node, and a drain connected to the third reference node, wherein a starting voltage of the second transistor of the first conductivity type and a starting voltage of the third transistor of the first conductivity type are the reference voltage.

In an embodiment, the switching unit comprises: a third transistor of the second conductivity type, having a source connected to the third reference node, a gate connected to the second reference node, and a drain connected to the reference voltage end.

In an embodiment, the power reset unit is an inverter having an input end connected to the third reference node and sending the power reset signal opposite to a voltage level of the third reference node.

In the above embodiments, the transistor of the first conductivity type is a p-type transistor, and the transistor of the second conductivity type is an n-type transistor.

Accordingly, the present invention provides a power reset circuit for providing a power reset signal to a chip and thereby resetting the state of the chip. In a standby mode, the power reset circuit severs a current path between a supply voltage source and the ground to achieve zero current consumption in the standby state.

BRIEF DESCRIPTION OF THE DRAWINGS

Objectives, features, and advantages of the present invention are hereunder illustrated with specific embodiments in conjunction with the accompanying drawings, in which.

DETAILED DESCRIPTION

Figure 1:
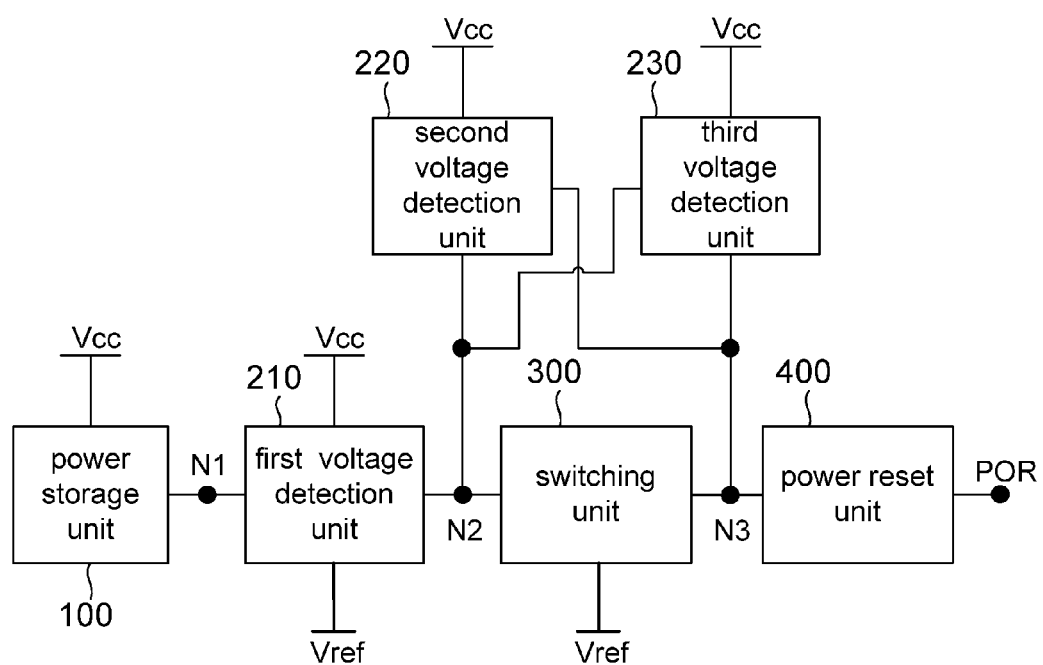
FIG. 1 is a function block diagram of a power reset circuit according to an embodiment of the present invention.

Referring to FIG. 1, there is shown a function block diagram of a power reset circuit according to an embodiment of the present invention.

A power reset circuit of the present invention generates a signal POR according to a change of a supply voltage source. When the signal is at a logic high level, the signal serves as a power reset signal for triggering a corresponding chip to perform a reset action.

In an embodiment of the present invention, a power reset circuit comprises a power storage unit 100, a first voltage detection unit 210, a second voltage detection unit 220, a third voltage detection unit 230, a switching unit 300, and a power reset unit 400.

The power storage unit 100 has a first critical voltage level. The power storage unit 100 has an input end connected to a supply voltage source and an output end connected to a first reference node N1. The power storage unit 100 is charged by the supply voltage source when the voltage level of a supply voltage source Vcc is higher than the first critical voltage level. The power storage unit 100 discharges when the voltage level of the supply voltage source Vcc is lower than the first critical voltage level, such that the first reference node N1 has a discharge voltage of the power storage unit 100.

The first voltage detection unit 210 is connected between the first reference node N1 and a second reference node N2. The first voltage detection unit 210 receives the supply voltage source Vcc, thereby causing a voltage of the second reference node N2 to track a voltage of the first reference node N1 when the supply voltage source Vcc is lower than a second critical voltage level. The first voltage detection unit 210 reduces a voltage of the second reference node N2 to a reference voltage Vref when the supply voltage source Vcc is higher than the second critical voltage level.

The second voltage detection unit 220 is connected between the supply voltage source Vcc and the second reference node N2. The second voltage detection unit 220 is connected to a third reference node N3 and controlled by the voltage level of the third reference node N3. The second voltage detection unit 220 enables the current path between the second reference node N2 and the supply voltage source Vcc of the second voltage detection unit 220 only when the third reference node N3 has the reference voltage Vref.

The third voltage detection unit 230 is connected between the supply voltage source Vcc and the third reference node N3. The third voltage detection unit 230 is connected to the second reference node N2 and controlled by the voltage level of the second reference node N2. The third voltage detection unit 230 enables the current path between the third reference node N3 and the supply voltage source Vcc of the third voltage detection unit 230 only when the second reference node N2 has the reference voltage Vref.

The switching unit 300 is connected between the third reference node N3 and a reference voltage end (supplying reference voltage Vref). The switching unit 300 is connected to the second reference node N2 and controlled by the voltage level of the second reference node N2. The switching unit 300 enables the current path between the reference voltage end and the third reference node N3 of the switching unit 300 only when the second reference node N2 has the reference voltage, thereby reducing the voltage level of the third reference node N3 to the voltage level of the reference voltage Vref.

An input end of the power reset unit 400 is connected to the third reference node N3, such that an output end of the power reset unit 400 generates the signal POR for serving as the power reset signal according to a voltage level of the third reference node N3, thereby resetting a corresponding circuit component.

Figure 2:
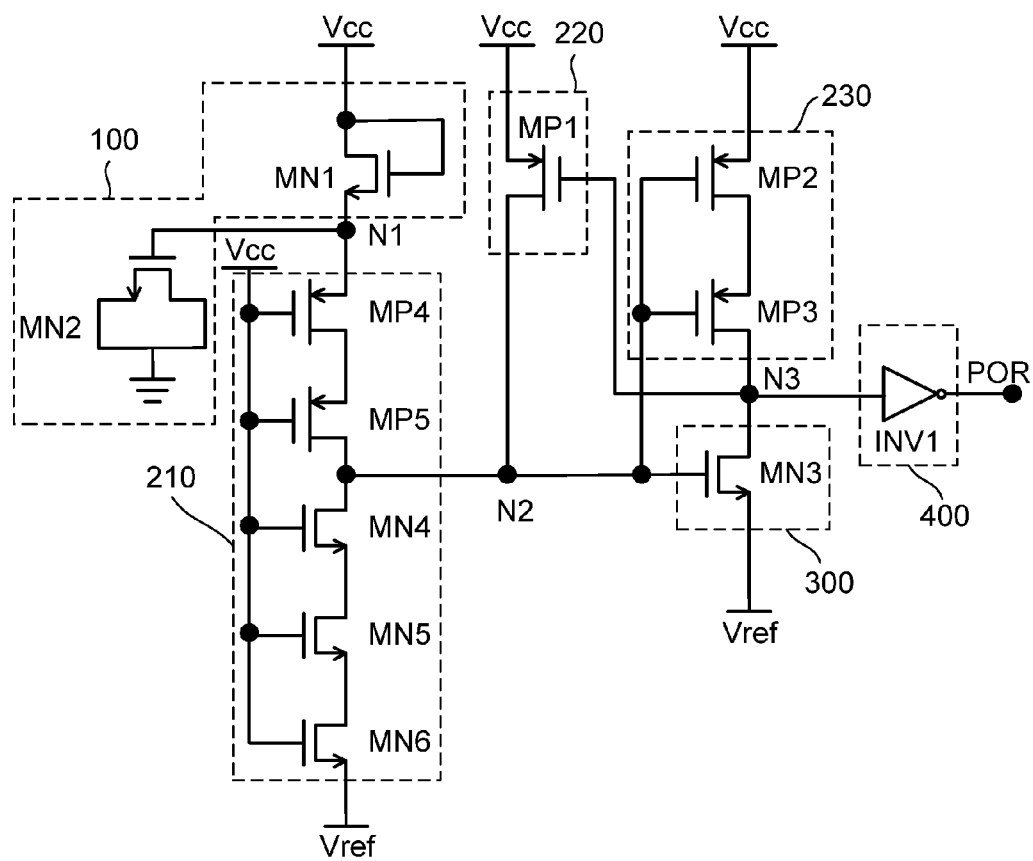
FIG. 2 is a circuit diagram of a power reset circuit according to an embodiment of the present invention.

Referring to FIG. 2, there is shown a circuit diagram of a power reset circuit according to an embodiment of the present invention.

In this embodiment, the power storage unit 100 comprises a first transistor of the second conductivity type MN1 and a second transistor of the second conductivity type MN2. Both a gate and a source of the first transistor of the second conductivity type MN1 are connected to the supply voltage source Vcc. A drain of the first transistor of the second conductivity type MN1 is connected to the first reference node. The second transistor of the second conductivity type MN2 has the first critical voltage level. A gate of the second transistor of the second conductivity type MN2 is connected to the first reference node. Both a source and a drain of the second transistor of the second conductivity type MN2 are grounded. The voltage across the first transistor of the second conductivity type MN1 decreases by an offset voltage (i.e., the first critical voltage level) according to the voltage level of the supply voltage source Vcc. Therefore, once the second transistor of the second conductivity type MN2 is charged fully, the voltage across the second transistor of the second conductivity type MN2 will be less than the supply voltage source Vcc by a first critical voltage level.

In this embodiment, the first voltage detection unit 210 comprises transistors of the first conductivity type (MP4, MP5) and transistors of the second conductivity type (MN4, MN5, MN6). The transistors of the first conductivity type (MP4, MP5) have the second critical voltage level. Two said transistors of the first conductivity type (MP4, MP5) are connected in series. A gate of each of two said transistors of the first conductivity type (MP4, MP5) is connected to the supply voltage source Vcc. A source of the first transistor MP4 of the first conductivity type is connected to the first reference node N1. A drain of the second transistor MP5 of the first conductivity type is connected to the second reference node N2. The transistors of the first conductivity type (MP4, MP5), which have the second critical voltage level, are configured in the manner that electrical conduction between the two transistors of the first conductivity type (MP4, MP5) will be enabled only if the supply voltage source Vcc is lower than the second critical voltage level. The transistors of the second conductivity type (MN4, MN5, MN6) have the second critical voltage level. Three said transistors of the second conductivity type (MN4, MN5, MN6) are connected in series. A gate of each of three said transistors of the second conductivity type (MN4, MN5, MN6) is connected to the supply voltage source. A source of the first transistor MN4 of the second conductivity type is connected to the second reference node N2. A drain of the third transistor MN6 of the second conductivity type is connected to the reference voltage Vref. The transistors of the second conductivity type (MN4, MN5, MN6), which have the second critical voltage level, are configured in the manner that electrical conduction between the three transistors of the second conductivity type (MN4, MN5, MN6) will be enabled only if the supply voltage source Vcc is higher than the second critical voltage level.

In this embodiment, the second voltage detection unit 220 comprises the first transistor of the first conductivity type MP1. The first transistor of the first conductivity type MP1 has a source connected to the supply voltage source Vcc, a drain connected to the second reference node N2, and a gate connected to the third reference node N3. The starting voltage of the first transistor of the first conductivity type MP1 is configured to be the reference voltage Vref.

In this embodiment, the third voltage detection unit 230 comprises the second transistor of the first conductivity type MP2 and the third transistor of the first conductivity type MP3. The second transistor of the first conductivity type MP2 has a source connected to the supply voltage source Vcc and a gate connected to the second reference node N2. The third transistor of the first conductivity type MP3 has a source connected to the drain of the second transistor of the first conductivity type MP2, a gate connected to the second reference node N2, and a drain connected to the third reference node N3. Both the second transistor of the first conductivity type MP2 and the third transistor of the first conductivity type MP3 are configured to use a starting voltage equal to the reference voltage Vref.

In this embodiment, the switching unit 300 comprises the third transistor of the second conductivity type MP3. The third transistor of the second conductivity type MP3 has a source connected to the third reference node N3, a gate connected to the second reference node N2, and a drain connected to the reference voltage end (for providing the reference voltage Vref).

In this embodiment, the power reset unit 400 is an inverter. The inverter INV1 has an input end connected to the third reference node N3. The inverter INV1 sends the signal POR opposite to the voltage level of the third reference node N3, such that the sent signal POR serves as a power reset signal for use with voltage ramp-up after power supply shutdown has happened to the supply voltage source Vcc.

FIG. 2 illustrates a power reset circuit of the present invention during a shutdown stage, a voltage ramp-up stage, and a normal supply stage of the supply voltage source Vcc. The description below is exemplified by the reference voltage Vref being a grounding voltage.

The supply voltage source Vcc enters the shutdown stage as soon as system power shuts down. The transistor MN2 starts a discharge process as soon as power shutdown happens to the supply voltage source Vcc. Due to the transistor MN1, the voltage across the transistor MN2 is less than the supply voltage source Vcc by a first critical voltage level; hence, although the transistor MN2 starts to discharge as soon as power shutdown happens to the supply voltage source Vcc, the voltage at the first reference node N1 drops quickly. All the transistors MP4, MP5, MN4, MN5, MN6 operate under the control of the voltage supplied by the supply voltage source Vcc; hence, the power shutdown of the supply voltage source Vcc causes the transistors MP4, MP5 to be ON and the transistors MN4, MN5, MN6 to be OFF. As a result, the voltage of the second reference node N2 tracks the voltage of the first reference node N1. Prior to the power shutdown of the supply voltage source Vcc, the transistors MN4, MN5, MN6 are not in the OFF state, and therefore the voltage of the second reference node N2 is a grounding voltage (this embodiment is exemplified by the reference voltage being a grounding voltage). Accordingly, once power shutdown happens to the supply voltage source Vcc, the transistors MN4, MN5, MN6 will be OFF, whereas the voltage of the second reference node N2 tracks the voltage of the first reference node N1 and thereby increases. The increase in the voltage of the second reference node N2 causes the transistor MN3 to be ON and the transistors MP2, MP3 to be OFF. As a result, the voltage of the third reference node N3 becomes equal to the grounding voltage eventually, whereas the transistor MP1 enters the ON stage. In doing so, the signal POR tracks the supply voltage source Vcc and has logic high voltage level 1 when acted on by the inverter.

System power shutdown is followed by voltage ramp-up. The voltage boost causes the transistors MP4, MP5 to be OFF and the transistors MN4, MN5, MN6 to be ON. Therefore, the voltage of the second reference node N2 decreases to the grounding voltage, thereby causing the transistor MN3 to be OFF and the transistors MP2, MP3 to be ON. With the transistors MP2, MP3 being ON, the voltage of the third reference node N3 tracks the supply voltage source Vcc; meanwhile, when acted on by the inverter, the signal POR changes from logic high voltage level 1 to logic low voltage level 0 and thereby becomes the power reset signal whereby a pulse is produced to reset a corresponding circuit component.

In case of normal power supply to the system, the power reset circuit will be in a standby state. In the standby state, the power reset circuit of the present invention is characterized by zero standby current consumption. During a normal supply stage of the supply voltage source Vcc, the transistor MN2 is charged under a voltage equal to the difference obtained by subtracting the first critical voltage level from the voltage of the supply voltage source Vcc, such that the transistor MN2 functions as a capacitor. The normal power supply of the supply voltage source Vcc causes the transistors MP4, MP5 to be OFF, the transistors MN4, MN5, MN6 to be ON, and the voltage of the second reference node N2 to be equal to the grounding voltage. Since the voltage of the second reference node N2 decreases to the grounding voltage, the transistor MN3 is OFF, and the transistors MP2, MP3 are ON. At this point in time, the voltage of the third reference node N3 is the voltage of the supply voltage source Vcc, and the transistor MP1 is OFF. In this stage, the voltage of the third reference node N3 is the voltage level of the supply voltage source Vcc, whereas the signal POR keeps logic low voltage level 0 when acted on by the inverter. Furthermore, in this stage, with the transistors MP4, MP5, MN3 being OFF, from the perspective of the supply voltage source Vcc, a current path leading to the ground does not exist, and thus current consumption does not occur, thereby achieving zero current consumption in a standby state.

This aforesaid embodiment assumes that changing the signal POR from logic high voltage level 1 to logic low voltage level 0 triggers a reset action of an electronic component.

In conclusion, a power reset circuit of the present invention severs the current path between the supply voltage source Vcc and the ground in a standby state to achieve zero current consumption in the standby state and thereby save energy.

The present invention is disclosed above by preferred embodiments. However, persons skilled in the art should understand that the preferred embodiments are illustrative of the present invention only, but should not be interpreted as restrictive of the scope of the present invention. Hence, all equivalent modifications and replacements made to the aforesaid embodiments should fall within the scope of the present invention. Accordingly, the legal protection for the present invention should be defined by the appended claims.

What is claimed is:

1. A power reset circuit with zero standby current consumption, for generating a power reset signal according to a change of a supply voltage source, comprising:

a power storage unit having a first critical voltage level, having an input end connected to the supply voltage source and an output end connected to the first reference node, being charged when a voltage level of the supply voltage source is higher than the first critical voltage level, and discharging when a voltage level of the supply voltage source is lower than the first critical voltage level;

a first voltage detection unit connected between the first reference node and a second reference node to receive the supply voltage source, thereby causing a voltage of the second reference node to track a voltage of the first reference node when the supply voltage source is lower than a second critical voltage level, and thereby reducing a voltage of the second reference node to a reference voltage when the supply voltage source is higher than a second critical voltage level;

a second voltage detection unit connected between the supply voltage source and the second reference node and connected to a third reference node, so as to enable a current path between the second reference node and the supply voltage source of the second voltage detection unit only when the third reference node has the reference voltage;

a third voltage detection unit connected between the supply voltage source and the third reference node and connected to the second reference node, so as to enable a current path between the third reference node and the supply voltage source of the third voltage detection unit only when the second reference node has the reference voltage;

a switching unit connected between the third reference node and a reference voltage end and connected to the second reference node so as to enable a current path between the reference voltage end and the third reference node of the switching unit only when the second reference node has the reference voltage, thereby reducing a voltage of the third reference node to the reference voltage; and a power reset unit having an input end connected to the third reference node and an output end for generating and outputting the power reset signal according to a voltage level of the third reference node.

2. The power reset circuit of claim 1, wherein the power storage unit comprises:

a first transistor of the second conductivity type, having a gate and a source both connected to the supply voltage source, and having a drain connected to the first reference node; and a second transistor of the second conductivity type, having the first critical voltage level, having a gate connected to the first reference node, and having a source and a drain both grounded.

3. The power reset circuit of claim 1, wherein the first voltage detection unit comprises:

transistors of the first conductivity type, having the second critical voltage level, being two series-connected transistors of the first conductivity type, and each having a gate connected to the supply voltage source, wherein a source of a first one of the transistors of the first conductivity type is connected to the first reference node, wherein a drain of a second one of the transistors of the first conductivity type is connected to the second reference node, wherein electrical conduction between the two transistors of the first conductivity type will be enabled only if the supply voltage source is lower than the second critical voltage level; and transistors of the second conductivity type, having the second critical voltage level, being three series-connected transistors of the second conductivity type, and each having a gate connected to the supply voltage source, wherein a source of a first one of the transistors of the second conductivity type is connected to the second reference node, wherein a drain of a third one of the transistors of the second conductivity type is connected to the reference voltage, wherein electrical conduction between the three transistors of the second conductivity type will be enabled only if the supply voltage source is higher than the second critical voltage level.

4. The power reset circuit of claim 3, wherein the transistor of the first conductivity type is a p-type transistor, and the transistor of the second conductivity type is an n-type transistor.

5. The power reset circuit of claim 1, wherein the second voltage detection unit comprises:

a first transistor of the first conductivity type, having a source connected to the supply voltage source, a drain connected to the second reference node, and a gate connected to the third reference node, wherein a starting voltage of the first transistor of the first conductivity type is the reference voltage.

6. The power reset circuit of claim 1, wherein the third voltage detection unit comprises:

a second transistor of the first conductivity type, having a source connected to the supply voltage source and a gate connected to the second reference node; and a third transistor of the first conductivity type, having a source connected to a drain of the second transistor of the first conductivity type, a gate connected to the second reference node, and a drain connected to the third reference node, wherein a starting voltage of the second transistor of the first conductivity type and a starting voltage of the third transistor of the first conductivity type are the reference voltage.

7. The power reset circuit of claim 1, wherein the switching unit comprises:

a third transistor of the second conductivity type, having a source connected to the third reference node, a gate connected to the second reference node, and a drain connected to the reference voltage end.

8. The power reset circuit of claim 1, wherein the power reset unit is an inverter having an input end connected to the third reference node and sending the power reset signal opposite to a voltage level of the third reference node.

* * * * *